US008008175B1

(12) United States Patent  (10) Patent No.: US 8,008,175 B1
Cherekdjian  (45) Date of Patent: Aug. 30, 2011

(54) SEMICONDUCTOR STRUCTURE MADE USING IMPROVED SIMULTANEOUS MULTIPLE ION IMPLANTATION PROCESS

(75) Inventor: Sarko Cherekdjian, Campbell, CA (US)

(73) Assignee: Coring Incorporated, Corning, NY (US)

( * ) Notice: Subject to any disclaimer, the term of this patent is extended or adjusted under 35 U.S.C. 154(b) by 0 days.

(21) Appl. No.: 12/950,440

(22) Filed: Nov. 19, 2010

(51) Int. Cl.
*H01L 21/00* (2006.01)

(52) U.S. Cl. ........ 438/530; 438/527; 438/513; 438/514; 118/723 R

(58) Field of Classification Search .............. 438/530, 438/527, 513, 514; 118/723 R
See application file for complete search history.

(56) References Cited

U.S. PATENT DOCUMENTS

| 3,310,443 | A | 3/1967 | John et al. ................ 438/56 |
| 4,914,292 | A | 4/1990 | Tamai et al. .............. 250/251 |
| 5,189,303 | A | 2/1993 | Tanjyo et al. ............. 250/296 |
| 5,350,926 | A | 9/1994 | White et al. .......... 250/492.21 |
| 5,374,564 | A | 12/1994 | Bruel .................... 438/455 |
| 5,854,123 | A | 12/1998 | Sato et al. ............... 438/507 |
| 5,966,620 | A | 10/1999 | Sakaguchi et al. .......... 438/455 |
| 5,985,742 | A | 11/1999 | Henley et al. ............. 438/515 |
| 6,010,579 | A | 1/2000 | Henley et al. ............ 148/33.2 |
| 6,013,563 | A | 1/2000 | Henley et al. ............. 438/458 |
| 6,027,988 | A | 2/2000 | Cheung et al. ............ 438/513 |
| 6,146,979 | A | 11/2000 | Henley et al. ............. 438/458 |
| 6,150,239 | A | 11/2000 | Goesele et al. ............ 438/458 |
| 6,155,909 | A | 12/2000 | Henley et al. .............. 451/39 |
| 6,160,262 | A | 12/2000 | Aoki et al. ............ 250/492.21 |
| 6,162,705 | A | 12/2000 | Henley et al. ............. 438/478 |
| 6,211,041 | B1 | 4/2001 | Ogura .................... 438/458 |
| 6,245,645 | B1 | 6/2001 | Mitani et al. ............. 438/455 |
| 6,251,754 | B1 | 6/2001 | Ohshima et al. ........... 438/506 |
| 6,274,459 | B1 | 8/2001 | Chan .................... 438/475 |
| 6,300,227 | B1 | 10/2001 | Liu et al. ................ 438/513 |
| 6,303,468 | B1 | 10/2001 | Aspar et al. .............. 438/455 |
| 6,312,797 | B1 | 11/2001 | Yokokawa et al. .......... 428/336 |
| 6,344,404 | B1 | 2/2002 | Cheung et al. ............. 438/513 |
| 6,350,702 | B2 | 2/2002 | Sakaguchi et al. .......... 438/753 |
| 6,429,104 | B1 | 8/2002 | Auberton-Herve .......... 438/527 |
| 6,458,671 | B1 | 10/2002 | Liu et al. ................ 438/391 |
| 6,458,672 | B1 | 10/2002 | Henley et al. |

(Continued)

FOREIGN PATENT DOCUMENTS

JP 11-329996 11/1999

(Continued)

OTHER PUBLICATIONS

F. Kroner, et al., "Phosphorus Ion Shower Implantation for Special Power IC Application," IEEE, 2000, pp. 476-479.

(Continued)

*Primary Examiner* — Jarrett J Stark
*Assistant Examiner* — Nicholas Tobergte
(74) *Attorney, Agent, or Firm* — Bruce P. Watson

(57) ABSTRACT

Methods and apparatus provide for: a first source of plasma (first plasma), which includes a first species of ions, directing the first plasma out along a first axis; a second source of plasma (second plasma), which includes a second, differing, species of ions, directing the second plasma out along a second axis; and an accelerator system in communication with the first and second sources of plasma, and operating to: (i) accelerate the first species of ions at a first magnitude therethrough, and toward a semiconductor wafer, and (ii) simultaneously accelerate the second species of ions at a second magnitude, different from the first magnitude, therethrough, and toward the semiconductor wafer.

19 Claims, 4 Drawing Sheets

U.S. PATENT DOCUMENTS

| | | | |
|---|---|---|---|
| 6,468,884 B2 | 10/2002 | Miyake et al. | 438/481 |
| 6,486,008 B1 | 11/2002 | Lee | 438/149 |
| 6,544,862 B1 | 4/2003 | Bryan | 438/455 |
| 6,548,382 B1 | 4/2003 | Henley et al. | 438/526 |
| 6,566,233 B2 | 5/2003 | Yokokawa et al. | 438/455 |
| 6,597,039 B2 | 7/2003 | Ohmi et al. | 257/347 |
| 6,610,582 B1 | 8/2003 | Stewart | 438/455 |
| 6,613,678 B1 | 9/2003 | Sakaguchi et al. | 438/695 |
| 6,653,209 B1 | 11/2003 | Yamagata | 438/459 |
| 6,852,652 B1 | 2/2005 | Maa et al. | 438/933 |
| 6,927,148 B2 | 8/2005 | Ito | 38/458 |
| 7,166,524 B2 * | 1/2007 | Al-Bayati et al. | 438/530 |
| 7,176,528 B2 | 2/2007 | Couillard et al. | 257/347 |
| 7,291,545 B2 * | 11/2007 | Collins et al. | 438/510 |
| 7,323,398 B2 | 1/2008 | Akatsu | 438/458 |
| 7,326,628 B2 | 2/2008 | Mohamed et al. | 438/458 |
| 7,449,394 B2 | 11/2008 | Akatsu et al. | 438/458 |
| 7,456,080 B2 | 11/2008 | Gadkaree | 438/407 |
| 7,608,521 B2 | 10/2009 | Cites et al. | 438/455 |
| 7,737,013 B2 * | 6/2010 | Yin et al. | 438/527 |
| 2002/0064924 A1 | 5/2002 | Cheung et al. | 438/400 |
| 2002/0100880 A1 | 8/2002 | Chen et al. | 250/492.21 |
| 2003/0183876 A1 | 10/2003 | Takafuji et al. | 257/347 |
| 2004/0038504 A1 | 2/2004 | Ito | 438/520 |
| 2004/0171196 A1 | 9/2004 | Walitzki | 438/137 |
| 2004/0171232 A1 | 9/2004 | Cayrefourcq et al. | 438/458 |
| 2004/0214434 A1 | 10/2004 | Atwater et al. | 438/689 |
| 2004/0229444 A1 | 11/2004 | Couillard et al. | 438/455 |
| 2004/0232488 A1 | 11/2004 | Forbes | 257/347 |
| 2005/0026650 A1 | 2/2005 | Russell | 106/22 |
| 2005/0032330 A1 | 2/2005 | Ghyselen et al. | 438/455 |
| 2005/0040073 A1 | 2/2005 | Cody et al. | 208/89 |
| 2005/0042842 A1 | 2/2005 | Lei et al. | 438/459 |
| 2005/0070071 A1 | 3/2005 | Henley et al. | 438/459 |
| 2005/0079664 A1 | 4/2005 | Faris | 438/200 |
| 2005/0085049 A1 | 4/2005 | Atwater, Jr. et al. | 438/455 |
| 2005/0098742 A1 | 5/2005 | Kellerman et al. | 250/492.21 |
| 2005/0196936 A1 | 9/2005 | Daval et al. | 438/455 |
| 2006/0038227 A1 | 2/2006 | Aitken et al. | 257/347 |
| 2007/0281440 A1 | 12/2007 | Cites et al. | 438/458 |

FOREIGN PATENT DOCUMENTS

| | | |
|---|---|---|
| WO | 2005/029576 | 3/2005 |
| WO | 2006/023289 | 3/2006 |

OTHER PUBLICATIONS

Agarwal et al., Efficient production of silicon-on-insulator films by co-implantation of He+ with H+, Applied Physics Letters, 1998, vol. 72, No. 9, pp. 1086-1088.

V. C. Venezia, et al, "The Role of Implantation Damage In The Production of Silicon-On-Insulator Films by Co-Implantation of He and H" Electrochemical Society Proceedings vol. 981 pp. 1385.

M. K. Weldon, et al, "Mechanism of silicon exfoliation induced by hydrogen/helium c⊖implantation", Applied Physics Letters vol. 73, No. 25, Dec. 21, 1998.

* cited by examiner

SEMICONDUCTOR STRUCTURE MADE USING IMPROVED SIMULTANEOUS MULTIPLE ION IMPLANTATION PROCESS

BACKGROUND

The features, aspects and embodiments disclosed herein relate to the manufacture of semiconductor devices, such as semiconductor-on-insulator (SOI) structures, using an improved simultaneous multiple ion implantation process.

To date, the semiconductor material most commonly used in semiconductor-on-insulator structures has been silicon. Such structures have been referred to in the literature as silicon-on-insulator structures and the abbreviation "SOI" has been applied to such structures. SOI technology is becoming increasingly important for high performance thin film transistors, solar cells, thermo-electric conversion devices, and displays, such as active matrix displays. SOI structures may include a thin layer of substantially single crystal silicon on an insulating material.

Various ways of obtaining SOI structures include epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

Manufacture of SOI structures by these methods is costly. The latter method involving hydrogen ion implantation has received some attention and has been considered advantageous over the former methods because the implantation energies required are less than 50% of that of oxygen ion implants and the dosage required is two orders of magnitude lower.

U.S. Pat. No. 7,176,528 discloses a process that produces silicon on glass (SiOG) structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; (iv) cooling the structure to a common temperature; and (v) separating the glass substrate and a thin layer of silicon from the silicon wafer.

Although the manufacturing processes for making SOI structures is maturing, the commercial viability and/or application of final products employing them is limited by cost concerns. A significant cost in producing an SOI structure using the process disclosed in U.S. Pat. No. 7,176,528 is incurred during the ion implantation step. It is believed that reductions in the cost of carrying out the ion implantation process would improve the commercial application of SOI structures. Accordingly, it is desirable to continue to advance the efficiency of producing SOI structures.

Among the areas of the ion implantation process where costs are excessively high, include the resources required to prepare, and make operational, the sources of ions and the tools used for implantation. For example, when ion plasmas are employed to source ions for implantation, some type of plasma generator is required, such as an arc chamber or the like. Significant resources (time, personnel, and money) are required to make an arc chamber ready and operational. In addition, there are significant costs associated with making the semiconductor wafer (the work piece to be implanted with ions) ready to receive the ions. For example, some type of atmospheric control chamber (often called an end station) is usually employed to establish desirable conditions for implantation. These conditions may include carefully controlling vacuum, temperature, humidity, cleanliness, etc. within the chamber. Again, significant resources (time, personnel, and money) are required to make the end station ready and operational for a given ion implantation process.

The above cost issues are exacerbated when one is interested in implanting more than one species of ion into a given semiconductor wafer. Indeed, one prior art approach to multiple ion species implantation is to use a single machine approach (a single implanter set up with a single ion source) to implant one species of ion at a time. This typically involves setting up the source, accelerator equipment, and end station for one species of ion, implanting that species, and then ramping down the set up, and repeating the setup for the next species of ions. While the end station set up may remain through the transition of ion species, the transition of the ion source (including clearing the memory effect) from one species to another is very time consuming and costly.

An alternative system may employ a dual machine approach (two separate implanters, each with a dedicated ion source) to implant one species of ion at a time. This typically involves setting up both sources and accelerator equipment for both species of ion. The semiconductor wafer is placed in one of the end stations, brought to the proper atmospheric conditions, and one of the ion species is implanted. Then the semiconductor wafer is brought back to ambient conditions, transferred to the other end station, and brought back to the proper atmospheric conditions for the implantation of the second ion species. Thus, while the delays associated with transitioning a single source is reduced or eliminated, the cycling of the semiconductor wafer through two different end stations is time consuming and costly. Since transport between two end stations is required, the possibility of substrate contamination is also significantly higher in the dual machine approach.

Therefore, irrespective of which approach is employed (single or dual machine), the costs associated with preparing, and making operational, the ion sources and/or end stations used during the multiple ion species implantation processes are excessive.

There have been advancements made to the prior art approach to implanting more than one species of ion into a given semiconductor wafer. For example, one new approach is to implant both species of ions into the semiconductor wafer simultaneously. Details of this approach may be found in co-owned and co-pending U.S. Ser. No. 12/709,833, filed Feb. 2, 2010, entitled SEMICONDUCTOR STRUCTURE MADE USING IMPROVED ION IMPLANTATION PROCESS, the entire disclosure of which is incorporated herein in its entirety. While this new approach is very promising, additional research and advancements have been made, which are believed to provide reasonable alternatives, if not significant advantages, over the foregoing processes.

SUMMARY

Although the features, aspects and embodiments disclosed herein may be discussed in relation to the manufacture of semiconductor-on-insulator (SOI) structures, skilled artisans will understand that such disclosure need not be limited to SOI manufacturing. Indeed, the broadest protectable features, aspects, etc. disclosed herein are applicable to any process in which ion implantation into (or onto) semiconductor material is required, whether such semiconductor material is used in conjunction with an insulator or otherwise.

For ease of presentation, however, the disclosure herein may be made in relation to the manufacture of SOI structures. The specific references made herein to SOI structures are to facilitate the explanation of the disclosed embodiments and are not intended to, and should not be interpreted as, limiting the scope of the claims in any way. The SOI abbreviation is used herein to refer to semiconductor-on-insulator structures in general, including, but not limited to, semiconductor-on-glass (SOG) structures, silicon-on-insulator (SOI) structures, and silicon-on-glass (SiOG) structures, which also encompasses silicon-on-glass-ceramic structures. In the context of this description, SOI may also refer to semiconductor-on-semiconductor structures, such as silicon-on-silicon structures, etc.

In accordance with one or more embodiments herein, methods and apparatus of forming a semiconductor structure, include: subjecting an implantation surface of a semiconductor wafer to an ion implantation process to create an exfoliation layer therein, wherein the ion implantation process includes implanting two different species of ions into the implantation surface of the semiconductor wafer, each species being implanted simultaneously.

Other aspects, features, advantages, etc. will become apparent to one skilled in the art when the description of the embodiments herein is taken in conjunction with the accompanying drawings.

BRIEF DESCRIPTION OF THE DRAWINGS

For the purposes of illustrating the various aspects and features disclosed herein, there are shown in the drawings forms that are presently preferred, it being understood, however, that the covered embodiments are not limited to the precise arrangements and instrumentalities shown.

DETAILED DESCRIPTION

Figure 1:
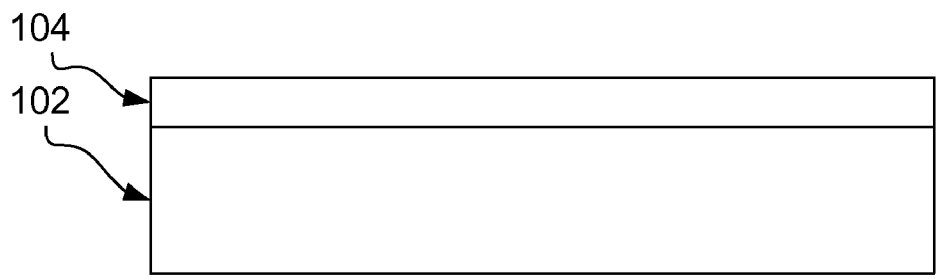
FIG. 1 is a block diagram illustrating the structure of a semiconductor device in accordance with one or more embodiments disclosed herein.

With reference to the drawings, wherein like numerals indicate like elements, there is shown in FIG. 1 a semiconductor-on-substrate structure 100 in accordance with one or more embodiments disclosed herein. In order to provide some specific context in which to discuss the broadest protectable features and aspects disclosed herein, it will be assumed that the semiconductor-on-substrate structure 100 is an SOI structure, such as a semiconductor-on-glass structure.

The SOI structure 100 may include a substrate 102, and a semiconductor layer 104. Such an SOI structure 100 may have suitable uses in connection with fabricating thin film transistors (TFTs), e.g., for display applications, including organic light-emitting diode (OLED) displays and liquid crystal displays (LCDs), integrated circuits, photovoltaic devices, etc. Although not required, the semiconductor material of the layer 104 may be in the form of a substantially single-crystal material. The word "substantially" is used in describing the layer 104 to take into account the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The substrate 102, may be any desirable material exhibiting any desirable characteristics. For example, in some embodiments, the substrate 102 may be formed from a semiconductor material, such as the above-listed varieties.

In accordance with alternative embodiments, the substrate 102 may be an insulator, such as glass, an oxide glass, or an oxide glass-ceramic. As between oxide glasses and oxide glass-ceramics, the glass may have the advantage of being simpler to manufacture, thus making them more widely available and less expensive. By way of example, a glass substrate 102 may be formed from glass containing alkaline-earth ions, such as, substrates made of CORNING INCORPORATED GLASS COMPOSITION NO. 1737 or CORNING INCORPORATED GLASS COMPOSITION NO. EAGLE 2000™. These glass materials have particular use in, for example, the production of liquid crystal displays.

While the subject matter of particular interest herein involves ion implantation into semiconductor material, it is believed that providing some additional context in terms of a specific process for manufacturing the SOI 100 is beneficial. Thus, reference is now made to FIGS. 2-5, which illustrate a general process (and resultant intermediate structures) within which the aforementioned ion implantation may be carried out in order to manufacture the SOI structure 100 of FIG. 1.

Figure 2:
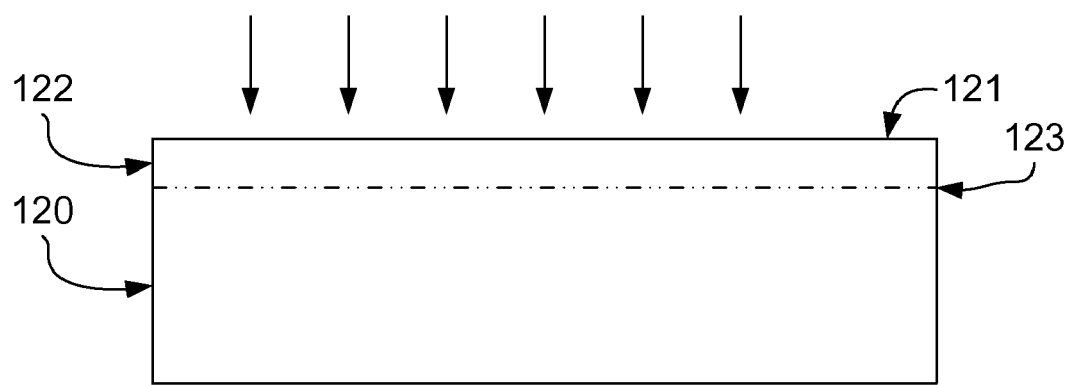
FIGS. 2-5 are schematic diagrams illustrating intermediate structures formed using processes of manufacturing the semiconductor device of FIG. 1.

Turning first to FIG. 2, a donor semiconductor wafer 120 is prepared, such as by polishing, cleaning, etc. to produce a relatively flat and uniform implantation surface 121 suitable for bonding to the substrate 102, e.g., a glass or glass-ceramic substrate. For the purposes of discussion, the semiconductor wafer 120 may be a substantially single crystal Si wafer, although as discussed above any other suitable semiconductor material may be employed.

An exfoliation layer 122 is created by subjecting the implantation surface 121 to an ion implantation process to create a weakened region 123 below the implantation surface 121 of the donor semiconductor wafer 120. Although it is this ion implantation process that is the focus of the disclosure herein, at this point only general reference will be made to the process for creating the weakened region 123. Later in this description, however, a more detailed discussion of one or more ion implantation processes of specific interest will be provided. The ion implantation energy may be adjusted using to achieve a general thickness of the exfoliation layer 122, such as between about 300-500 nm, although any reasonable thickness may be achieved. The effect of ion implantation into the donor semiconductor wafer 120 is the displacement of atoms in the crystal lattice from their regular locations. When the atom in the lattice is hit by an ion, the atom is forced out of position and a primary defect, a vacancy and an interstitial atom, is created, which is called a Frenkel pair. If the implantation is performed near room temperature, the components of the primary defect move and create many types of secondary defects, such as vacancy clusters, etc.

Figure 3:
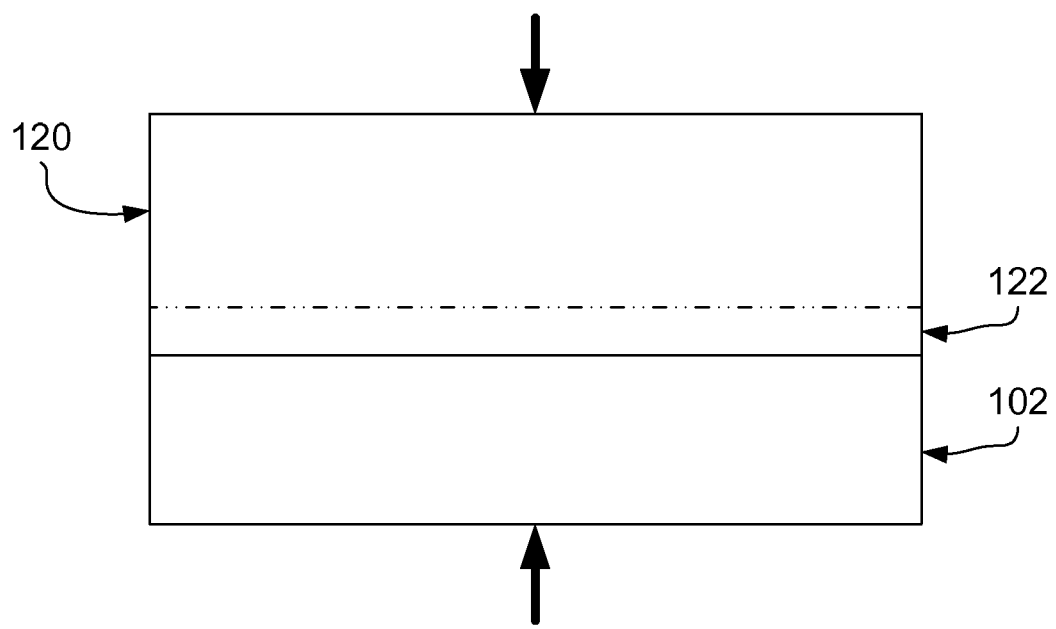

With reference to FIG. 3, the substrate 102 may be bonded to the exfoliation layer 122 using an electrolysis process (also referred to herein as an anodic bonding process). A basis for a suitable electrolysis bonding process may be found in U.S. Pat. No. 7,176,528, the entire disclosure of which is hereby incorporated by reference. Portions of this process are discussed below; however, one or more embodiments described herein are directed to modifications of the ion implantation process of U.S. Pat. No. 7,176,528.

In the bonding process, appropriate surface cleaning of the substrate 102 (and the exfoliation layer 122 if not done already) may be carried out. Thereafter, the intermediate structures are brought into direct or indirect contact. The resulting intermediate structure is thus a stack, including the bulk material layer of the donor semiconductor wafer 120, the exfoliation layer 122, and the glass substrate 102.

Prior to or after the contact, the stack of the donor semiconductor wafer 120, the exfoliation layer 122, and the glass substrate 102 is heated (indicated by the arrows in FIG. 3). The glass substrate 102 and the donor semiconductor wafer 120 are taken to a temperature sufficient to induce ion migration within the stack and an anodic bond therebetween. The temperature is dependent on the semiconductor material of the donor wafer 120 and the characteristics of the glass substrate 102. By way of example, the temperature of the junction may be taken to within about +/−350° C. of a strain point of the glass substrate 102, more particularly between about −250° C. and 0° C. of the strain point, and/or between about −100° C. and −50° C. of the strain point. Depending on the type of glass, such temperature may be in the range of about 500-600° C.

In addition to the above-discussed temperature characteristics, mechanical pressure (indicated by the arrows in FIG. 3) is applied to the intermediate assembly. The pressure range may be between about 1 to about 50 psi. Application of higher pressures, e.g., pressures above 100 psi, might cause breakage of the glass substrate 102.

A voltage (indicated by the arrows in FIG. 3) is also applied across the intermediate assembly, for example with the donor semiconductor wafer 120 at the positive electrode and the glass substrate 102 the negative electrode. The application of the voltage potential causes alkali or alkaline earth ions in the glass substrate 102 to move away from the semiconductor/glass interface further into the glass substrate 102. More particularly, positive ions of the glass substrate 102, including substantially all modifier positive ions, migrate away from the higher voltage potential of the donor semiconductor wafer 120, forming: (1) a reduced positive ion concentration layer in the glass substrate 102 adjacent the exfoliation layer 122; and (2) an enhanced positive ion concentration layer of the glass substrate 102 adjacent the reduced positive ion concentration layer. This formation results in barrier functionality, i.e., preventing positive ion migration back from the oxide glass or oxide glass-ceramic, through the reduced positive ion concentration layer, and into the semiconductor layer.

Figure 4:
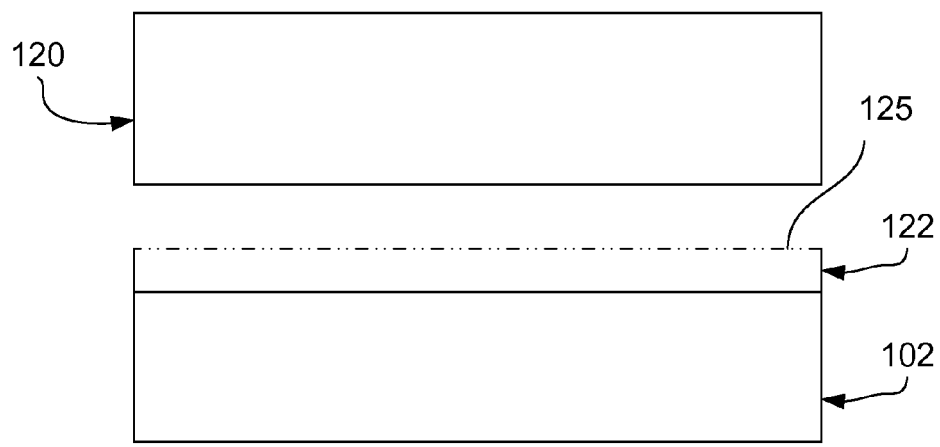
Figure 5:
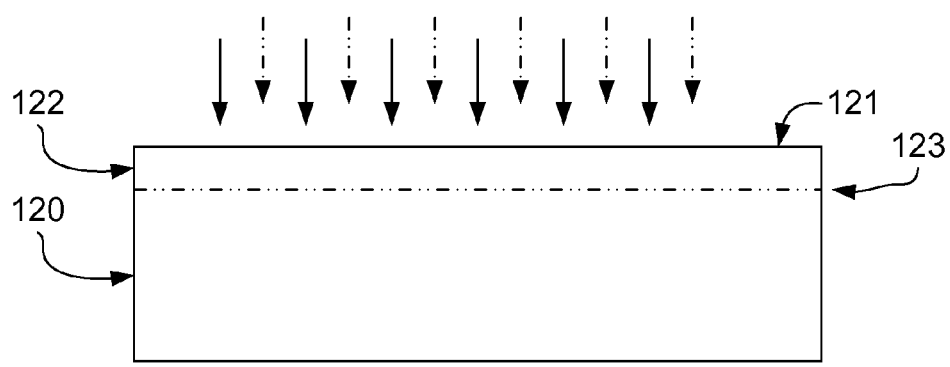

With reference to FIG. 4, after the intermediate assembly is held under the conditions of temperature, pressure and voltage for a sufficient time, the voltage is removed and the intermediate assembly is allowed to cool to room temperature. At some point during heating, during a dwell, during cooling, and/or after cooling, the donor semiconductor wafer 120 and the glass substrate 102 are separated. This may include some peeling if the exfoliation layer 122 has not already become completely free from the donor 120. The result is a glass substrate 102 with the relatively thin exfoliation layer 122 formed of the semiconductor material of the donor semiconductor layer 120 bonded thereto. The separation may be accomplished via fracture of the exfoliation layer 122 due to thermal stresses. Alternatively or in addition, mechanical stresses such as water jet cutting or chemical etching may be used to facilitate the separation.

The cleaved surface 125 of the SOI structure 100, just after exfoliation, may exhibit surface roughness, excessive silicon layer thickness, and/or implantation damage of the silicon layer (e.g., due to the formation of an amorphized silicon layer). Depending on the implantation energy and implantation time, the thickness of the exfoliation layer 122 may be on the order of about 300-500 nm, although other thicknesses may also be suitable. These characteristics may be altered using post bonding processes in order to advance from the exfoliation layer 122 and produce the desirable characteristics of the semiconductor layer 104 (FIG. 1). It is noted that the donor semiconductor wafer 120 may be reused to continue producing other SOI structures 100.

Reference is now made to FIG. 5, which is again directed to the creation of the exfoliation layer 122 by subjecting the implantation surface 121 of the donor semiconductor wafer 120 to an ion implantation process to create the weakened region 123 below the implantation surface 121 of the donor semiconductor wafer 120. In accordance with one or more embodiments, the ion implantation process includes implanting two different species of ions into the implantation surface 121 of the donor semiconductor wafer 120. In accordance with preferred aspects, the two different species of ions are implanted simultaneously using an improved apparatus and process.

Figure 6:
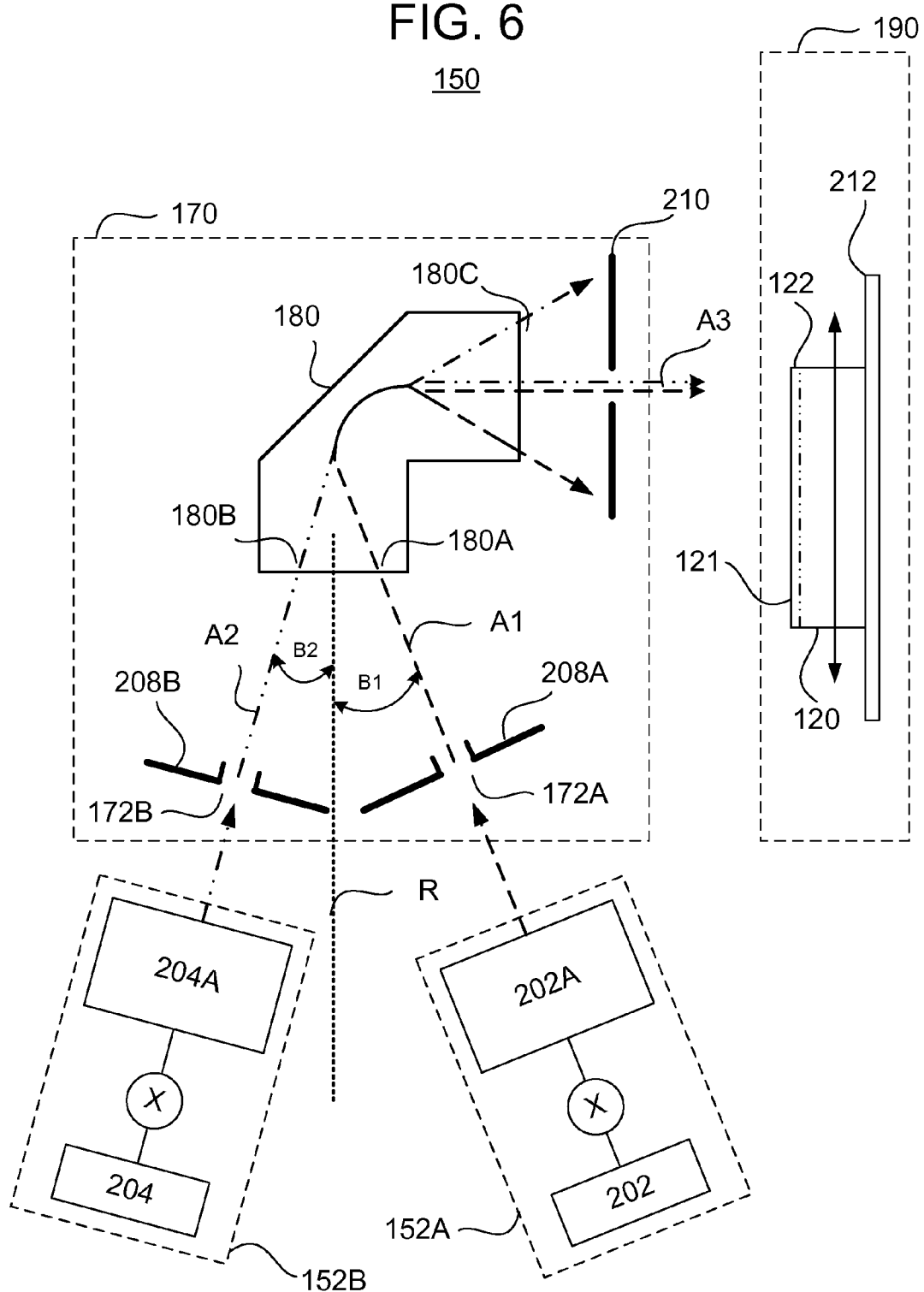
FIG. 6 is a simplified block diagram and schematic diagram of an apparatus (a single beam implant tool) suitable for implanting a donor semiconductor wafer with ions to produce an intermediate structure useful in manufacturing the semiconductor device of FIG. 1.

With reference to FIG. 6, the simultaneous implantation of the two different types of ions may be carried out in a single beam implant tool 150. Such a tool 150 may be purchased commercially and then modified to achieve the process described herein, or a substantially new tool may be developed. As the design and operating principle of implant tools may differ, the specific modifications in equipment and/or operation will be left to the skilled artisan, but should be based on the description herein.

The ion implant tool 150 of FIG. 6 is illustrated in high-level schematic form and includes a source 152 of plasma, which itself includes first and second sources of plasma 152A, 152B. More particularly, the respective sources 152A, 152B include first and second sources of gas, e.g. a first tank 202 and a second tank 204, each feeding a respective chamber 202A, 204A. The tanks 202, 204 are areas that produce the gas vapor required for the plasma generation in the plasma chamber. The tanks 202, 204 may contain gases, liquids or solids. For liquids and solids, a level of heating is required to generate the gas vapors. For gaseous sources, each of the tanks 202, 204 includes a respective gas, which contains a respective species of atoms and/or molecules. By way of example, the first tank 202 may contain atoms and/or molecules of hydrogen, and the second tank 204 may contain atoms and/or molecules of helium. Other atom and/or molecule species are also possible, such as being taken from the group consisting of: boron, hydrogen, helium, and/or other suitable species of atoms and/or molecules.

In accordance with one or more embodiments, one or both of the respective chambers 202A, 204A may include the structural elements necessary to produce plasma from the gas associated therewith. For example, the first chamber 202A may be implemented using an arc chamber, which includes the magnets, filaments, reflectors, energy sources, etc. necessary to receive the gas from the tank 202 and produce a first source of plasma. Similar structure may be included in the second chamber 204A. It is understood that those skilled in the art are well aware of the basic structural elements necessary to produce plasma from gas using, for example an arc chamber. It is understood, however, that any other suitable and known technique for producing plasma from gas may additionally or alternatively be employed. Thus, the first source 152A of plasma (first plasma), which includes a first species of ions, may be produced within the first chamber 202A, and the second source 152B of plasma (second plasma), which includes a second, differing, species of ions, may be produced within the second chamber 204A.

Those skilled in the art will appreciate that, depending on the species of atoms and/or molecules within the gas, the plasma may include differing types of ions, while still being within a species. For example, in the case of hydrogen, the first plasma may include H ions, $H_2$ ions, and $H_3$ ions. In the case of helium, the second plasma may include substantially only $He_4$ ions.

As discussed above, those skilled in the art will appreciate that there is a substantial amount of time needed to ramp up a chamber from a cold start to a state suitable for producing high-density plasma. Indeed, set up time includes adjustments for the species of ion, and the magnets, filaments, reflectors, energy sources, etc. must all ramp up and settle into proper conditions for plasma generation. As will be discussed further herein, each of the first and second chambers 202A, 204A, however, may be ramped up and ready to produce plasma simultaneously. The simultaneous production of the first and second plasma has significant cost saving advantages, at least because there need not be a first set up for the first plasma, followed by a ramp down and re-set up for the second plasma. Rather, there is effectively only one set up time (both chambers being set up in parallel), and no time is lost switching over from one species of ion to another. This advantage in addition to others will be discussed further with relation to other aspects of the system 150 that have yet to be presented.

Notably, the first source of plasma 152A, which includes the first species of ions, directs the first plasma out along a first axis, A1. Similarly, the second source of plasma 152B, which includes the second species of ions, directs the second plasma out along a second axis, A2. The respective axes A1, A2 are obviously different, each axis being characterized by a respective angle B1, B2 from a reference R, which is illustrated as being along the vertical.

The respective sources 152A, 152B are in communication with the next phase of the system 150, which is an accelerator system 170. The output of the first source 152A is in communication with a first input (or inlet) 172A of the accelerator system 170, which input is in communication with, and receives, the first plasma along the first axis, A1. Similarly, the output of the second source 152B is in communication with a second input (or inlet) 172B of the accelerator system 170, which input is in communication with, and receives, the second plasma along the second axis, A2.

The accelerator system 170 operates to simultaneously accelerate the first and second plasma along the respective first and second axes A1, A2 from the respective sources 152A, 152B. The accelerator system 170 accelerates the first species of ions at a first magnitude through, and toward, the semiconductor wafer 120, while simultaneously accelerating the second species of ions at a second magnitude, different from the first magnitude, through, and toward the semiconductor wafer 120. More specifically, the accelerator system 170 includes any number of electrodes, three such electrodes 208A, 208B, and 210 being shown by way of example. An appropriate, respective, voltage potential (which may be in the range of 10's to 100's of K volts) is established between the electrodes 208A, 210 and between the electrodes 208B, 210. Thus, a first electric field of a first magnitude is established between the electrodes 208A, 210, which operates to accelerate the first plasma along the first axis, A1. Similarly, a second electric field of a second magnitude, differing from the first magnitude, is established between the electrodes 208B, 210, which operates to accelerate the second plasma along the second axis, A2.

The accelerator system 170 includes an analyzer magnet 180, and causes the first and second plasma to accelerate toward and through the analyzer magnet 180. The analyzer magnet 180 includes first and second plasma inputs 180A, 180B, and an ion output 180C. The first plasma input 180A is in communication with, and receives, the accelerated first plasma along the first axis, A1, and the second plasma input 180B is in communication with, and receives, the accelerated second plasma along the second axis, A2.

The analyzer magnet 180 operates to alter a trajectory of the first species of ions from the first plasma by a first amount such that a first ion beam, including the first species of ions exits through the output 180C along a third axis A3. The analyzer magnet 180 simultaneously operates to alter a trajectory of the second species of ions from the second plasma by a second amount, different from the first amount, such that a second ion beam, including the second species of ions, exits through the output 180C along the third axis, A3.

The change in trajectory of the ions within the first and second plasma will depend on a number of factors, including the strength of the magnetic field produced by the analyzer magnet 180, the angle between the ion entry trajectory and the angle exit trajectory within the analyzer, the mass/charge ratio of the ions, the acceleration magnitude of the ions as they pass through the magnet 180, etc., all of which are known in the art.

The accelerator system 170 applies differing electric fields (of differing magnitudes) to the first and second plasma, thereby accelerating the respective first and second species of ions to velocities that exhibit differing momentums. Indeed, recall that the first and second plasma include, for example, H ions, $H_2$ ions, $H_3$ ions, and $He_4$ ions. Each of these types of ions is of a differing mass, and therefore each of the types of ions will achieve a different momentum through the analyzer magnet 180.

The analyzer magnet 180 applies a given magnetic field to both the first and second species of ions. Since the different species of ions have different momentums, the given magnetic force alters the trajectories of the respective first and second species of ions by differing amounts. Thus, the analyzer magnet 180 alters the trajectory of the first species of ions from the first plasma, producing at least one first ion beam along the first axis, A3, and simultaneously alters the trajectory of the second species of ions from the second plasma, producing at least one second ion beam along the same third axis, A3. By altering the source angles B1, B2 with respect to the analyzer (the incident entry angle to the analyzer) a component of a plasma maybe directed to the third axis, A3. By altering both source angles, two components (each generated from an alternative plasma, i.e., 202A and 204A) can be directed to the third axis, A3. Angles B1 and B2 in FIG. 6 are adjustable and allow for changes in incident components of plasmas and alterations to the accelerating voltages (produced by electrodes 208A and 208B). Altering B1 and B2 are key in allowing two selected ion beams along the first and second axes A1, A2 to coincide on the third axis, A3.

Even within a species, such as hydrogen ions, there may be differing numbers of atomic bonds between atoms and thus, the resulting H ions, $H_2$ ions, and $H_3$ ions will each have a differing momentum. Likewise, the $He_4$ ions will have a different momentum than the hydrogen ions. Thus, the H ions, $H_2$ ions, $H_3$ ions, and $He_4$ ions leave the analyzer magnet 180 at differing trajectories when the associated plasmas have the same incident entry angle to the analyzer. For purposes of example, it is assumed that the desired ion species for implanting the semiconductor wafer 120 are $H_2$ ions and $He_4$ ions. Thus, the respective first and second electric fields, the respective entry angles of the first and second plasma to the analyzer, the magnetic force, etc., are set such that both the $H_2$ ions and the $He_4$ ions attain the trajectory along the third axis A3. This may cause other types of ions, even within the same species, to stray off the third axis A3, such as H and $H_3$ ions, and fail to reach the semiconductor wafer 120.

The system 150 also includes an end station 190 operating to support and translate the semiconductor wafer 120 such that the first and second species of ions, simultaneously, bombard the implantation surface 121 to create the exfoliation layer 122 therein. The end station 190 includes a transport mechanism 212, which permits the semiconductor wafer 120 to translate, or scan, (see the bi-directional arrow) in appropriate directions, such that the respective ion beams paint the semiconductor wafer 120 and suitable target doses are achieved. In an alternative end station configuration, rotating process disks may be employed to rotate the semiconductor wafer 120 through the ion beams, as opposed to the relatively linear translation of the semiconductor wafer shown in FIG. 6.

The end station 190 also operates to maintain a controlled atmosphere within which the semiconductor wafer 120 is disposed during implantation. Preferably, the atmosphere includes a suitable vacuum, temperature, humidity, cleanliness, etc. In this regard, the end station 190 includes an input in communication with the output from the accelerator system 170, whereby the ion beams may be received, but the controlled atmosphere is not lost.

The ability to maintain the atmospheric conditions within the end station 190 during the entire period of implantation of both species of ions saves considerable time. Further, as discussed above, there is no need to take the time to ramp up the first or second chambers 202A, 204A between implantation. Instead, both chambers are ready and the system 150 applies both first and second plasma simultaneously. This results in very significant cost and time savings. The ability to simultaneously implant two species of ions reduces the process time from performing two separate implants to performing only a single implant. This provides enhanced throughput resulting in further cost savings. A single tool can now accomplished a similar throughput of a dual machine employing two single beam ion implanters. This then provides a saving of factory floor space, facility cost saving, and capitol cost saving.

While the above embodiments have been discussed with specific reference to the structure of the respective tools 150, 200, one skilled in the art will appreciate that inventive aspects apply to one or more processes as well.

In this regard, a method of forming a semiconductor structure may include: directing a first source of plasma (first plasma), which includes a first species of ions along a first axis; directing a second source of plasma (second plasma), which includes a second, differing, species of ions along a second axis; accelerating the first species of ions at a first magnitude toward a semiconductor wafer; and simultaneously accelerating the second species of ions at a second magnitude, different from the first magnitude, and toward the semiconductor wafer.

The method may also include: applying a first electric field of a first magnitude to accelerate the first plasma along the first axis; and applying a second electric field of a second magnitude, differing from the first magnitude, to accelerate the second plasma along the second axis. The first and second electric fields may be applied simultaneously. Resultantly, the method may further include: imparting a first momentum to the first species of ions along the first axis; and imparting a second momentum, different from the first momentum, to the second species of ions along the second axis. Again, the first and second momentums may be imparted simultaneously.

The method may additionally or alternatively include: altering a trajectory of the first species of ions from the first plasma by a first amount such that a first ion beam, including the first species of ions exits through the output thereof along a third axis; and altering a trajectory of the second species of ions from the second plasma by a second amount, different from the first amount, such that a second ion beam, including the second species of ions exits through the output thereof along the third axis. The first and second ion beams, respectively, may be accelerated toward the semiconductor wafer. The first and second amounts of altering the respective first and second ion beams may likewise be performed simultaneously.

The method may additionally or alternatively include disposing the semiconductor wafer in an end station providing a controlled atmosphere during the implantation. Such controlled atmosphere may include maintaining a vacuum within the end station during implantation.

Although the aspects, features, and embodiments disclosed herein have been described with reference to particular details, it is to be understood that these details are merely illustrative of broader principles and applications. It is therefore to be understood that numerous modifications may be made to the illustrative embodiments and that other arrangements may be devised without departing from the spirit and scope of the appended claims.

The invention claimed is:

1. An apparatus, comprising:
   a first source of plasma (first plasma), which includes a first species of ions, directing the first plasma out along a first axis;
   a second source of plasma (second plasma), which includes a second, differing, species of ions, directing the second plasma out along a second axis; and
   an accelerator system in communication with the first and second sources of plasma, and operating to: (i) accelerate the first species of ions at a first magnitude therethrough, and toward a semiconductor wafer, and (ii) simultaneously accelerate the second species of ions at a second magnitude, different from the first magnitude, therethrough, and toward the semiconductor wafer.

2. The apparatus of claim 1, further comprising: an end station operating to support and translate the semiconductor wafer such that the first and second species of ions, simultaneously bombard an implantation surface of the semiconductor wafer to create an exfoliation layer therein.

3. The apparatus of claim 2, wherein the end station operates to maintain a controlled atmosphere within which the semiconductor wafer is disposed during implantation.

4. The apparatus of claim 1, wherein:
   the first source of plasma includes a source of a first species of atoms and/or molecules in communication with a first chamber, the first chamber operating to produce the plasma having the first species of ions from the first species of atoms and/or molecules; and the second source of plasma includes a source of a second species of atoms and/or molecules in communication with a second chamber, the second chamber operating to produce the plasma having the second species of ions from the second species of atoms and/or molecules.

5. The apparatus of claim 1, wherein the accelerator system includes first and second plasma inputs, the first plasma input being in communication with and receiving the first plasma along the first axis, and the second plasma input being in communication with and receiving the source plasma along the second axis.

6. The apparatus of claim 5, wherein the accelerator system operates to simultaneously produce:

a first electric field of a first magnitude to accelerate the first plasma along the first axis; and a second electric field of a second magnitude, differing from the first magnitude, to accelerate the second plasma along the second axis.

7. The apparatus of claim 6, wherein the accelerator system simultaneously imparts a first momentum to the first species of ions by way of the first electric field, and a second momentum to the second species of ions by way of the second electric field.

8. The apparatus of claim 7, further comprising:

an analyzer magnet system having first and second plasma inputs and an ion output, wherein:

the first plasma input is in communication with and receives the accelerated first plasma along the first axis;

the second plasma input is in communication with and receives the accelerated second plasma along the second axis;

the analyzer magnet system operates to alter a trajectory of the first species of ions from the first plasma by a first amount such that a first ion beam, including the first species of ions exits through the output thereof along a third axis;

the analyzer magnet system operates to alter a trajectory of the second species of ions from the second plasma by a second amount, different from the first amount, such that a second ion beam, including the second species of ions exits through the output thereof along the third axis; and the accelerator system operates to accelerate the first and second ion beams, respectively, from the analyzer magnet system toward the semiconductor wafer.

9. The apparatus of claim 1, wherein the first and second species of ions are taken from the group consisting of: boron, hydrogen, and helium.

10. A method of forming a semiconductor structure, comprising:

directing a first source of plasma (first plasma), which includes a first species of ions along a first axis;

directing a second source of plasma (second plasma), which includes a second, differing, species of ions along a second axis;

accelerating the first species of ions at a first magnitude toward a semiconductor wafer; and simultaneously accelerating the second species of ions at a second magnitude, different from the first magnitude, and toward the semiconductor wafer.

11. The method of claim 10, further comprising:

applying a first electric field of a first magnitude to accelerate the first plasma along the first axis; and applying a second electric field of a second magnitude, differing from the first magnitude, to accelerate the second plasma along the second axis.

12. The method of claim 11, wherein the first and second electric fields are applied simultaneously.

13. The method of claim 10, further comprising:

imparting a first momentum to the first species of ions along the first axis; and imparting a second momentum, different from the first momentum, to the second species of ions along the second axis.

14. The method of claim 13, wherein the first and second momentums are imparted simultaneously.

15. The method of claim 10, further comprising:

altering a trajectory of the first species of ions from the first plasma by a first amount such that a first ion beam, including the first species of ions exits through the output thereof along a third axis;

altering a trajectory of the second species of ions from the second plasma by a second amount, different from the first amount, such that a second ion beam, including the second species of ions exits through the output thereof along the third axis; and accelerating the first and second ion beams, respectively, toward the semiconductor wafer.

16. The method of claim 15, wherein the first and second amounts of altering the respective the first and second ion beams is performed simultaneously.

17. The method of claim 10, further comprising disposing the semiconductor wafer in an end station providing a controlled atmosphere during the implantation.

18. The method of claim 17, further comprising maintaining a vacuum within the end station during implantation.

19. The method of claim 10, wherein the first and second species of ions are taken from the group consisting of: boron, hydrogen, and helium.

* * * * *